(12) United States Patent
Kim et al.

(10) Patent No.: US 11,355,728 B2
(45) Date of Patent: Jun. 7, 2022

(54) ELECTROLUMINESENCE DISPLAY HAVING THROUGH-HOLE IN DISPLAY AREA

(71) Applicant: LG Display Co., Ltd., Seoul (KR)

(72) Inventors: KaKyung Kim, Paju-si (KR); JaeHan Ahn, Paju-si (KR); KiBok Park, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/688,451

(22) Filed: Nov. 19, 2019

(65) Prior Publication Data

US 2020/0176520 A1    Jun. 4, 2020

(30) Foreign Application Priority Data

Dec. 4, 2018    (KR) .......................... 10-2018-0154584

(51) Int. Cl.
*H01L 27/32* (2006.01)
*H01L 51/52* (2006.01)

(52) U.S. Cl.
CPC ...... *H01L 51/5246* (2013.01); *H01L 27/3246* (2013.01); *H01L 51/5253* (2013.01)

(58) Field of Classification Search
CPC ............. H01L 51/5246; H01L 27/3246; H01L 51/5253; H01L 27/156; H01L 27/1214; H01L 23/481; H01L 33/12; H01L 33/22; H01L 33/36; H01L 33/56
See application file for complete search history.

(56) References Cited

U.S. PATENT DOCUMENTS

| | | | |
|---|---|---|---|
| 9,632,487 B2 | 4/2017 | Kim et al. | |
| 2017/0031323 A1 | 2/2017 | Kim et al. | |
| 2019/0334120 A1* | 10/2019 | Seo | H01L 51/5246 |
| 2020/0083475 A1* | 3/2020 | Kang | H01L 27/3258 |
| 2020/0119304 A1* | 4/2020 | Choi | H01L 51/52 |

FOREIGN PATENT DOCUMENTS

KR    10-2017-0015632 A    2/2017

* cited by examiner

*Primary Examiner* — Elias Ullah
(74) *Attorney, Agent, or Firm* — Fenwick & West LLP

(57) ABSTRACT

Disclosed is an electroluminescence display device having a through-hole in a display area thereof. The electroluminescence display device includes a substrate, a display area, a non-display area, a through-hole, an inner dam, and a concave-convex pattern. In the display area, a plurality of pixels, each of which includes a light emitting element that displays an image and a driving element that drives the light emitting element, are disposed on the substrate. The non-display area surrounds the display area on the substrate. The through-hole is disposed in the display area and does not include the substrate, the light emitting elements, and the driving elements. The inner dam surrounds the through-hole. The concave-convex pattern surrounds the through-hole between the through-hole and the inner dam.

20 Claims, 7 Drawing Sheets

//  # ELECTROLUMINESENCE DISPLAY HAVING THROUGH-HOLE IN DISPLAY AREA

CROSS-REFERENCE TO RELATED APPLICATION

This application claims the benefit of Republic of Korea Patent Application No. 10-2018-0154584 filed on Dec. 4, 2018, which is hereby incorporated by reference in its entirety.

BACKGROUND

Field of Technology

The present disclosure relates to an electroluminescent display device having a through-hole in a display area. Particularly, the present disclosure relates to an electroluminescent display device in which a camera hole in which a device that receives light via a substrate is disposed or a through-hole into which an additional device penetrating a substrate is inserted is disposed in a display area.

Discussion of the Related Art

An electroluminescent display device out of display devices employs a spontaneous emission system, has excellent viewing angle, contrast ratio, and the like, and can be decreased in weight and thickness and is advantageous in power consumption because a separate backlight is not required. Particularly, an organic lighting emitting display (OLED) device out of electroluminescent display device can be driven with a low DC voltage, has a high response speed, and has low manufacturing costs.

An electroluminescent display device includes a plurality of electroluminescent diodes. An electroluminescent diode includes an anode electrode, a light emitting layer that is formed on the anode electrode, and a cathode electrode that is formed on the lighting emitting layer. When a high-potential voltage is applied to the anode electrode and a low-potential voltage is applied to the cathode electrode, holes in the anode electrode and electrons in the cathode electrode move to the lighting emitting layer. When holes and electrons are coupled in the light emitting layer, excitons are formed in the course of excitation and light is generated due to energy from the excitons. An electroluminescent display device displays an image by electrically controlling a quantity of light which is generated in the light emitting layers of a plurality of electroluminescent diodes which are individually partitioned by banks.

An electroluminescent display device can be much decreased in thickness and has excellent flexibility, and is applied to various products in various fields. However, the electroluminescent display device is weak to moisture and oxygen. With this problem, it is very important to prevent external permeation of moisture and oxygen for the purpose of application to various fields and development as various types of display devices.

SUMMARY

The present disclosure provides an electroluminescent display device in which a display area is maximized by disposing a camera hole in which an additional device that receives light via a substrate or a through-hole into which a component penetrating a substrate is inserted in the display area. The present disclosure also provides an electroluminescent display device having a structure for preventing permeation of moisture into a light emitting element which is a display element disposed around a through-hole even when the through-hole is disposed in a display area.

According to an embodiment of the present disclosure, there is provided an electroluminescent display device including a display area, a non-display area, a through-hole, an inner dam, and a concave-convex pattern. In the display area, a plurality of pixels, each of which includes a light emitting element that displays an image and a driving element that drives the light emitting element, are disposed on a substrate. The non-display area surrounds the display area on the substrate. The through-hole is disposed in the display area and does not include the substrate, the light emitting elements, and the driving elements. The inner dam surrounds the through-hole. The concave-convex pattern surrounds the through-hole between the through-hole and the inner dam.

For example, each light emitting element may include a pixel electrode, a light emitting layer, and a common electrode. The pixel electrode is connected to the corresponding driving element. The light emitting layer is disposed entirely in the display area and stacked on the pixel electrode. The common electrode is stacked on the light emitting layer.

For example, the concave-convex pattern may include two concave portions and one convex portion. The two concave portions are disposed to expose a top surface of the substrate between the through-hole and the inner dam and to be adjacent to each other. The convex portion is disposed between the two concave portions.

For example, the concave-convex pattern may include a bottom surface, a top surface, and side walls. The bottom surface is defined by the top surface of the substrate exposed by the concave portions. The top surface of the concave-convex pattern is defined on an uppermost surface of the convex portion. The side walls connect the bottom surface and the top surface of the concave-convex pattern. The light emitting layer of each light emitting element is stacked on the bottom surface and the top surface of the concave-convex pattern other than the side walls.

For example, the side walls of the concave-convex pattern may include a sawteethed surface including a protruding surface and a recessed surface which are alternately continuous.

For example, the light emitting layer may have a structure in which the light emitting layer is cut off between the protruding surface and the recessed surface.

For example, each light emitting element may be disposed on a buffer film that is stacked on the substrate, a gate insulating film that is stacked on the buffer film, an intermediate insulating film that is stacked on the gate insulating film, and a planarization film that is stacked on the intermediate insulating film. The concave-convex pattern may include a bottom surface and a side wall. The bottom surface is a top surface of the substrate which is exposed via the buffer film, the gate insulating film, the intermediate insulating film, and the planarization film between the through-hole and the inner dam. The side wall connects the bottom surface and a top surface of the planarization film. The light emitting layer is stacked on the top surface of the planarization film and the bottom surface other than the side wall.

For example, the side wall may include a protruding surface and a recessed surface that are alternately continuous due to a difference in etching rate between the buffer film, the gate insulating film, the intermediate insulating film, and the planarization film. The light emitting layer may have a structure in which the light emitting layer is cut off in a stepped portion between the protruding surface and the recessed surface.

For example, the electroluminescent display device may further include a camera that is disposed to correspond to the through-hole.

For example, the electroluminescent display device may further include a buffer film, a thin-film transistor layer, a planarization film, a pixel driving electrode, and a bank. The buffer film is stacked on the substrate. The thin-film transistor layer is disposed on the buffer film. The planarization film covers the thin-film transistor layer. The pixel driving electrode is connected to a thin-film transistor disposed in the thin-film transistor layer and disposed on the planarization film. The bank defines an emission area in the pixel driving electrode. The concave-convex pattern may include two concave portions and one convex portion. The two concave portions are formed to expose a top surface of the substrate by removing the bank, the planarization film, the thin-film transistor layer, and the buffer film and disposed to be separated from each other by a predetermined distance. The convex portion has a width corresponding to the predetermined distance between the two concave portions.

For example, the concave-convex pattern may include a bottom surface, a top surface, and side walls. The bottom surface is defined by the top surface of the substrate exposed by the concave portions. The top surface of the concave-convex pattern is defined on an uppermost surface of the convex portion. The side walls connect the bottom surface and the top surface of the concave-convex pattern. The light emitting layer of each light emitting element may be stacked on the bottom surface and the top surface of the concave-convex pattern other than the side walls.

For example, each side wall may include a sawteethed surface that is formed by differentially etching the bank, the planarization film, the thin-film transistor layer, and the buffer film.

For example, the electroluminescent display device may further include an outer dam, a light emitting layer, a common electrode, and an encapsulation film. The outer dam is disposed in the non-display area and surrounds the display area. The light emitting layer covers the pixels on the bank between the outer dam and the through-hole, the inner dam, and the concave-convex pattern. The common electrode is stacked on the light emitting layer. The encapsulation film covers the common electrode.

For example, the through-hole may not include the buffer film, the thin-film transistor layer, the planarization film, the light emitting layer, the common electrode, and the encapsulation film. The light emitting layer may be exposed from a side surface of the through-hole.

For example, the encapsulation layer may include a first inorganic encapsulation layer, an organic encapsulation layer, and a second inorganic encapsulation layer. The organic encapsulation layer is disposed on the first inorganic encapsulation layer. The second inorganic encapsulation layer is disposed on a top surface of the organic encapsulation layer. The organic encapsulation layer may be in contact with a part of an inner surface of the inner dam. The first inorganic encapsulation layer and the second inorganic encapsulation layer between the through-hole and the inner dam may be in surface contact with each other.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION

Figure 1:
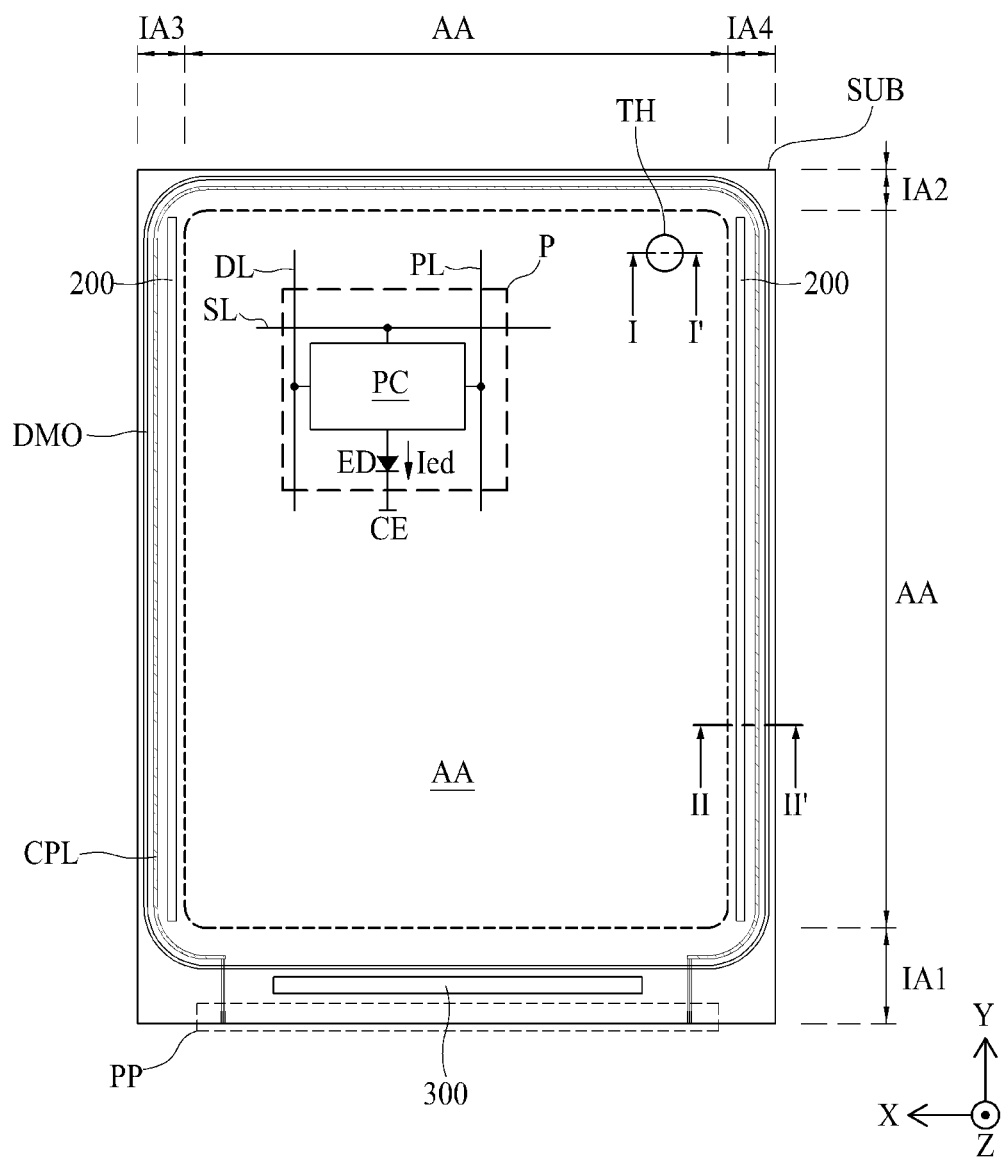
FIG. 1 is a plan view illustrating an electroluminescent display device including a through-hole in a display area according to the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where "comprise", "have", and "include" described in the present specification are used, another part may be added unless "only-" is used. The terms of a singular form may include plural forms unless referred to the contrary.

In construing an element, the element is construed as including an error range although there is no explicit description.

In describing a positional relationship, for example, when a position relation between two parts is described as "on~", "over~", "under~", and "next~", one or more other parts may be disposed between the two parts unless "just" or "direct" is used.

In describing a temporal relationship, for example, when the temporal order is described as "after~", "subsequent~", "next~", and "before~", a case which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

An electroluminescent display device according to the present disclosure will be described below. In the following description, an example of an electroluminescent display device will be described in detail with reference to the accompanying drawings. In the drawings, the same elements will be referred to by the same reference signs as much as possible.

Hereinafter, an electroluminescent display device according to exemplary embodiments of the present disclosure will be described in detail with reference to the accompanying drawings. FIG. 1 is a plan view illustrating an electroluminescent display device including a through-hole in a display area according to the present disclosure. Referring to FIG. 1, the electroluminescent display device according to the present disclosure includes a substrate SUB, pixels P, a common power supply line CPL, an outer dam DMO, driving units PP, 200 and 300, and a through-hole TH.

The substrate SUB is a base board (or a base layer) and is formed of a plastic material or a glass material. The substrate SUB is preferably transparent in view of characteristics of a display device. However, for example, in a top emission system, the substrate SUB may be formed of an opaque material.

For example, the substrate SUB two-dimensionally has a quadrangular shape, a quadrangular shape of which corners are rounded with a predetermined radius of curvature, or a non-quadrangular shape having at least six sides. Here, the substrate SUB having a non-quadrangular shape includes at least one protruding portion or at least one notched portion.

For example, the substrate SUB may be partitioned into a display area AA and a non-display area IA. The display area AA is provided in a substantially middle part of the substrate SUB and is defined as an area for displaying an image. For example, the display area AA has a quadrangular shape, a quadrangular shape of which corners are rounded with a predetermined radius of curvature, or a non-quadrangular shape having at least six sides. Here, the display area AA having a non-quadrangular shape includes at least one protruding portion or at least one notched portion.

The non-display area IA is provided in edges of the substrate SUB to surround the display area AA and is defined as an area in which an image is not displayed or a circumferential area. For example, the non-display area IA includes a first non-display area IA1 that is provided at a first edge of the substrate, a second non-display area IA2 that is provided at a second edge of the substrate SUB which is parallel to the first non-display area IA1, a third non-display area IA3 that is provided at a third edge of the substrate SUB, and a fourth non-display area IA4 that is provided at a fourth edge of the substrate SUB which is parallel to the third non-display area IA3. For example, the first non-display area IA1 may be an upper (or lower) edge area of the substrate SUB, the second non-display area IA2 may be a lower (or upper) edge area of the substrate SUB, the third non-display area IA3 may be a left (or right) edge area of the substrate SUB, and the fourth non-display area IA4 may be a right (or left) edge area of the substrate SUB, but the present disclosure is not limited thereto.

The pixels P are disposed in the display area AA of the substrate SUB. For example, a plurality of pixels may be disposed in a matrix in the display area AA of the substrate SUB. The pixels P are disposed in areas which are defined by scan lines SL, data lines DL, and pixel driving power supply lines PL, respectively.

The scan lines SL extend in a first direction X and are disposed at predetermined intervals in a second direction Y crossing the first direction X. The display area AA of the substrate SUB includes a plurality of scan lines SL that are parallel to each other in the first direction X and are separated from each other in the second direction Y. Here, the first direction X is defined as a horizontal direction of the substrate SUB and the second direction Y is defined as a vertical direction of the substrate SUB, but the present disclosure is not limited thereto and may be defined on the contrary thereto.

The data lines DL extend in the second direction Y and are disposed at predetermined intervals in the first direction X. The display area AA of the substrate SUB includes a plurality of data lines DL that are parallel to the second direction Y and are separated from each other in the first direction X.

The pixel driving power supply lines PL are disposed on the substrate SUB to be parallel to the data lines DL. The display area AA of the substrate SUB includes a plurality of pixel driving power supply lines PL that are parallel to the data lines DL. Selectively, the pixel driving power supply lines PL may be disposed to be parallel to the scan lines SL.

One unit pixel includes a red subpixel, a green subpixel, and a blue subpixel, and the unit pixel may further include a white subpixel. For example, the pixels P may be disposed in a stripe pattern in the display area AA. The stripe pattern refers to a pattern in which subpixels of the same color are continuously disposed in one row or column and subpixels of different colors are alternately disposed. For example, red subpixels form a first column, green subpixels form a second column, blue subpixels form a third column, and the red column, the green column, and the blue column are repeatedly alternately disposed.

For example, the pixels P may be disposed in a pentile structure in the display area AA. In this case, a unit pixel includes at least one red subpixel, at least two green subpixels, and at least one blue subpixel which are disposed in a two-dimensional polygonal shape. For example, in one unit pixel having a pentile structure, one red subpixel, two green subpixels, and one blue subpixel are two-dimensionally disposed in an octagonal shape. In this case, the blue subpixel has an opening area (or an emission area) which is the largest, and the green subpixel has an opening area which is the smallest.

Each pixel P includes a pixel circuit PC that is electrically connected to the neighboring scan lines SL, the corresponding data line DL, and the corresponding pixel driving power supply line PL and a light emitting element ED that is electrically connected to the pixel circuit PC.

The pixel circuit PC controls a current Ied flowing from the pixel driving power supply line PL to the light emitting element ED on the basis of a data voltage which is supplied from the data line DL in response to a scan signal which is supplied from at least one scan line SL.

For example, each pixel circuit PC includes at least two thin-film transistors and one capacitor. For example, each pixel circuit PC may include a driving thin-film transistor that supplies a data current Ied based on a data voltage to the light emitting element ED, a switching thin-film transistor that supplies the data voltage supplied from the data line DL to the driving thin-film transistor, and a capacitor that stores a gate-source voltage of the driving thin-film transistor.

For example, each pixel circuit PC may include at least three thin-film transistors and at least one capacitor. For example, the pixel circuit PC includes a current supply circuit, a data supply circuit, and a compensation circuit depending on operations (or functions) of the at least three thin-film transistors. Here, the current supply circuit includes a driving thin-film transistor that supplies a data current Ied based on a data voltage to the light emitting element ED. The data supply circuit includes at last one switching thin-film transistors that supply the data voltage supplied form the data line DL to the current supply circuit in response to at least one scan signal. The compensation circuit includes at least one compensation thin-film transistor that compensates for change in characteristic values (a threshold voltage and/or mobility) of the driving thin-film transistor in response to at least one scan signal.

Each light emitting element ED emits light with luminance corresponding to the data current Ied in response to the data current Ied which is supplied from the pixel circuit PC. In this case, the data current Ied flows from the pixel driving power supply line PL to a common power supply line CPL via the light emitting element ED.

For example, each light emitting element ED may include an inorganic light emitting diode or an organic light emitting diode. For example, each light emitting element ED includes a pixel driving electrode AE (or a first electrode or an anode) that is electrically connected to a pixel circuit PC, a light emitting layer EL that is formed on the pixel driving electrode AE, and a common electrode CE (or a second electrode or a cathode) that is electrically connected to the light emitting layer EL.

The common power supply line CPL is disposed in the non-display area IA of the substrate SUB and is electrically connected to the common electrode CE disposed in the display area AA. For example, the common power supply line CPL is disposed along the second to fourth non-display areas IA2, IA3, and IA4 which are adjacent to the display area AA of the substrate SUB with a constant line width and surrounds parts of the display area AA other than the part adjacent to the first non-display area IA1 of the substrate SUB. One end of the common power supply line CPL is disposed on one side of the first non-display area IA1 and the other end of the common power supply line CPL is disposed on the other side of the first non-display area IA1. One end and the other end of the common power supply line CPL are disposed to surround the second to fourth non-display areas IA2, IA3, and IA4. Accordingly, the common power supply line CPL has two-dimensionally a "⋂-shape" in which one side corresponding to the first non-display area IA1 of the substrate SUB is open.

Although not illustrated in FIG. 1, the electroluminescent display device according to the present disclosure further includes an encapsulation layer that protects the light emitting elements ED. The encapsulation layer is formed on the substrate SUB to surround the display area AA and the top surface and the side surface of the common power supply line CPL. On the other hand, the encapsulation layer exposes one end and the other end of the common power supply line CPL in the first non-display area IA1. The encapsulation layer serves to prevent oxygen or moisture from permeating the light emitting elements ED which are disposed in the display area AA. For example, the encapsulation layer may include at least one inorganic film. For example, the encapsulation layer may include a plurality of inorganic films and an organic film interposed between the plurality of inorganic films.

A driving unit according to an embodiment of the present disclosure includes a pad part PP, a gate driving circuit 200, and a driving integrated circuit 300.

The pad part PP includes a plurality of pads which are provided in the non-display area IA of the substrate SUB. For example, the pad part PP may include a plurality of common power supply pads, a plurality of data input pads, a plurality of power supply pads, and a plurality of control signal input pads which are provided in the first non-display area IA1 of the substrate SUB.

The gate driving circuit 200 is provided in the third non-display area IA3 and/or the fourth non-display area IA4 of the substrate SUB and is connected to the scan lines SL provided in the display area AA in a one-to-one correspondence manner. The gate driving circuit 200 is formed as an integrated circuit in the third non-display area IA3 and/or the fourth non-display area IA4 of the substrate SUB in the same process as a process of manufacturing the pixels P, that is, a process of manufacturing the thin-film transistors. The gate driving circuit 200 drives a plurality of scan lines SL in a predetermined order by generating a scan signal on the basis of a gate control signal supplied from the driving integrated circuit 300 and outputting the generated scan signals in a predetermined order. For example, the gate driving circuit 200 may include a shift register.

The outer dam DMO is provided in the first non-display area IA1, the second non-display area IA2, the third non-display area IA3, and the fourth non-display area IA4 of the substrate SUB and has a closed curve structure surrounding the display area AA. For example, the outer dam DMO is disposed outside the common power supply line CPL and is located in the outermost part on the substrate SUB. The pad part PP and the driving integrated circuit 300 are preferably disposed in an area outside the outer dam DMO.

The outer dam DMO is disposed in the outermost part in FIG. 1, but the present disclosure is not limited thereto. For example, the outer dam DMO may be disposed between the common power supply line CPL and the gate driving circuit 200. For example, the outer dam DMO may be disposed between the display area AA and the driving integrated circuit 300.

The driving integrated circuit 300 is mounted in a chip mounting area which is defined in the first non-display area IA1 of the substrate SUB through a chip mounting (or bonding) process. Input terminals of the driving integrated circuit 300 are directly connected to the pad part PP and thus a plurality of data lines DL provided in the display area AA are electrically connected to a plurality of pixel driving power supply lines PL. The driving integrated circuit 300 receives various powers, a timing synchronization signal, and digital image data from a display driving circuit unit (or a host circuit) via the pad part PP, generates gate control signals on the basis of the timing synchronization signal, controls driving of the gate driving circuit 200, converts the digital image data into analog pixel data voltages, and supplies the analog pixel data voltages to the corresponding data lines DL.

The through-hole TH physically penetrates the display device. For example, the through-hole TH can be formed to penetrate only a display panel of the display device. In this case, a structure in which a polarization film or cover glass which is bonded to the top surface of the display panel is not penetrated and the through-hole TH is covered can be provided. When a through-hole TH for transmitting light such as a camera hole or an optical sensor hole is provided, the through-hole TH may penetrate only the display panel and may not penetrate the polarization film or the cover glass. For example, when an additional device penetrating the whole display device is intended to be provided, a through-hole TH that penetrates the display panel and an optical film and a cover glass bonded thereon may be provided.

Since a display element is not provided in the through-hole TH, the through-hole TH is disposed in the non-display area IA. In this case, since a width or a length of the display area AA corresponding to a width or a length of the through-hole TH as well as the area of the through-hole TH decreases, the area ratio of the display area AA to the display panel also decreases. In the present disclosure, the through-hole TH is disposed in the display area AA. Accordingly, since a display element is not disposed in only the area associated with the through-hole TH in the display area AA and display elements are disposed around the through-hole TH, it is possible to maximize the area ratio of the display area AA to the display panel.

Figure 2:
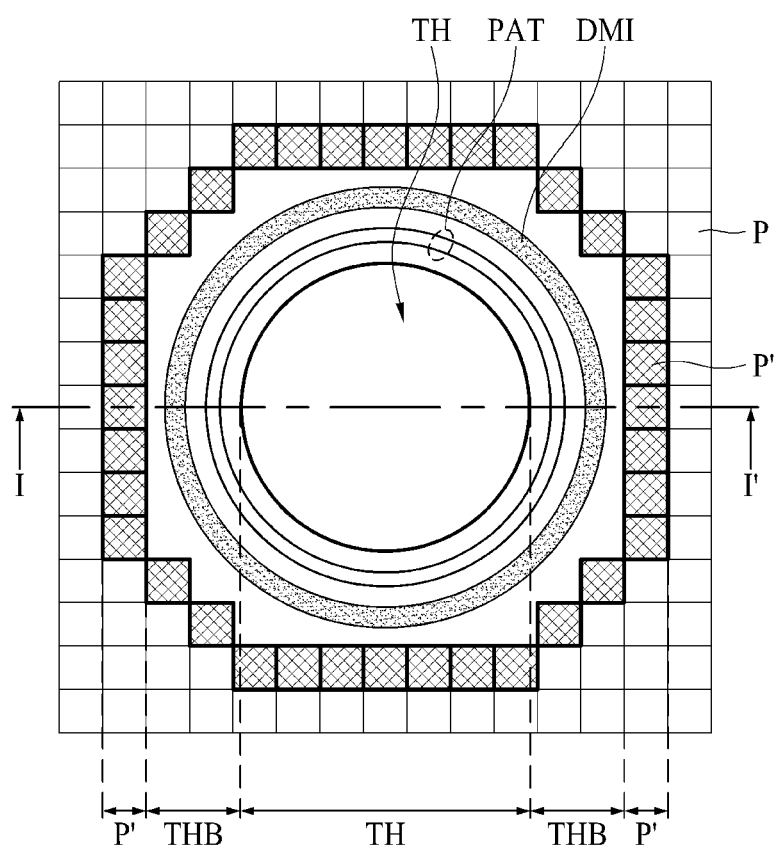
FIG. 2 is an enlarged plan view illustrating a structure of a through-hole which is disposed in the display area of the electroluminescent display device according to the present disclosure.

Hereinafter, structural features of a through-hole which characterizes the present disclosure will be described in more detail with reference to FIG. 2. FIG. 2 is an enlarged plan view illustrating a structure of a through-hole which is disposed in the display area of the electroluminescent display device according to the present disclosure.

Referring to FIG. 2, a through-hole TH is disposed in the display area AA. Pixels P are disposed around the through-hole TH. Pixels P which are disposed to be closest to the through-hole TH out of the pixels P can be defined as neighboring pixels P'. A part between the neighboring pixels P' and the through-hole TH is defined as a hole boundary part THB. The neighboring pixels P' disposed around the through-hole TH are pixels that normally display image information similarly to the other pixels P.

In the hole boundary part THB, an inner dam DMI and a concave-convex pattern PAT are disposed. Particularly, the inner dam DMI is disposed between the through-hole TH and the neighboring pixels P'. The inner dam DMI has a closed curve shape surrounding the through-hole TH to correspond to the shape of the through-hole TH. The inner dam DMI may have a closed curve shape different from that of the through-hole TH or may have a closed curve shape with the same shape but a different magnitude. For example, the inner dam DMI and the through-hole TH may be concentrically separated from each other with a constant gap therebetween.

The concave-convex pattern PAT is disposed between the through-hole TH and the inner dam DMI. The concave-convex pattern PAT also has a closed curve shape surrounding the through-hole TH to correspond to the shape of the through-hole TH. The concave-convex pattern PAT may have a closed curve shape different from that of the through-hole TH or may have a closed curve shape with the same shape but a different magnitude. For example, as illustrated in FIG. 2, the concave-convex pattern PAT and the through-hole TH may be concentrically separated from each other with a constant gap therebetween.

Figure 3:
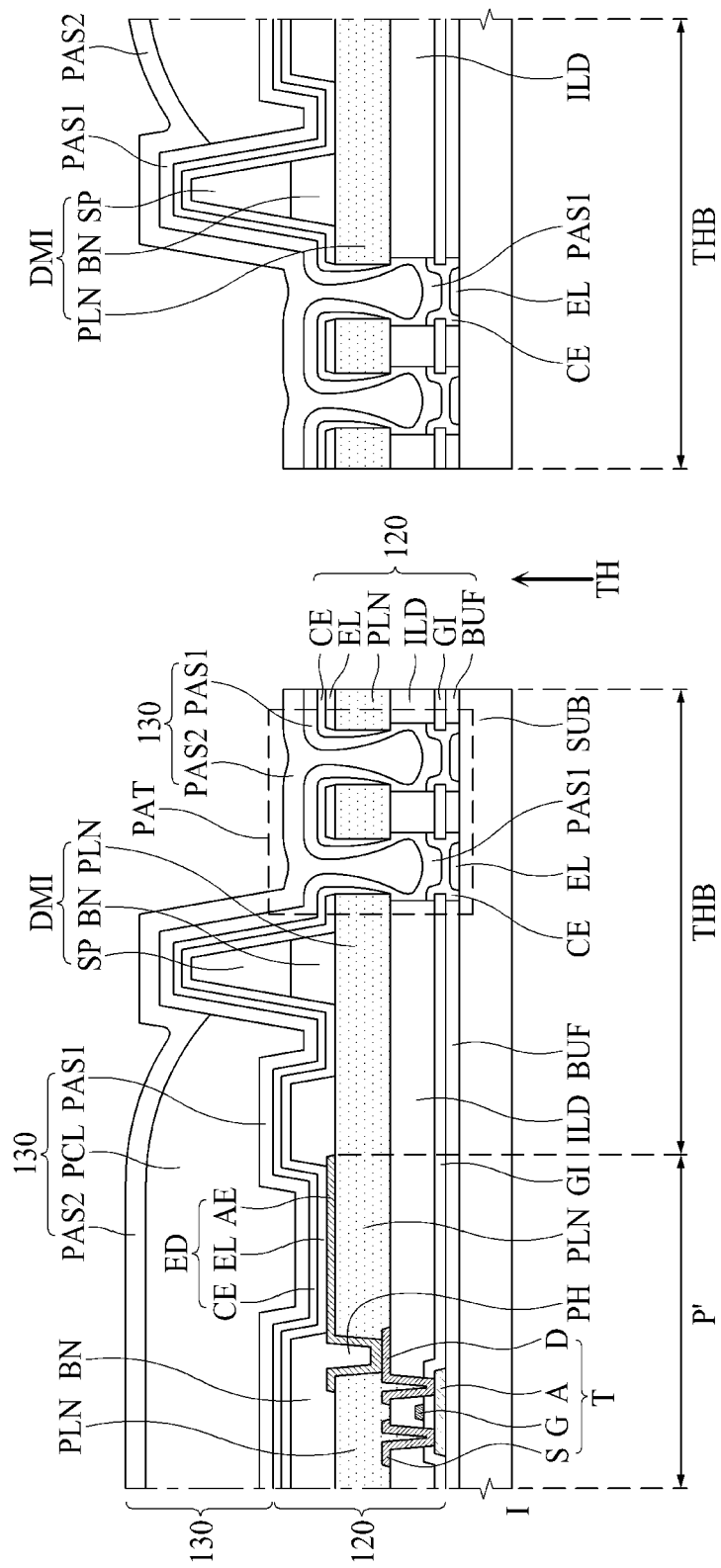
FIG. 3 is a sectional view taken along line I-I' in FIG. 1 and illustrates a structure of a part in which a through-hole is disposed in an electroluminescent display device according to an exemplary embodiment of the present disclosure.
Figure 4:
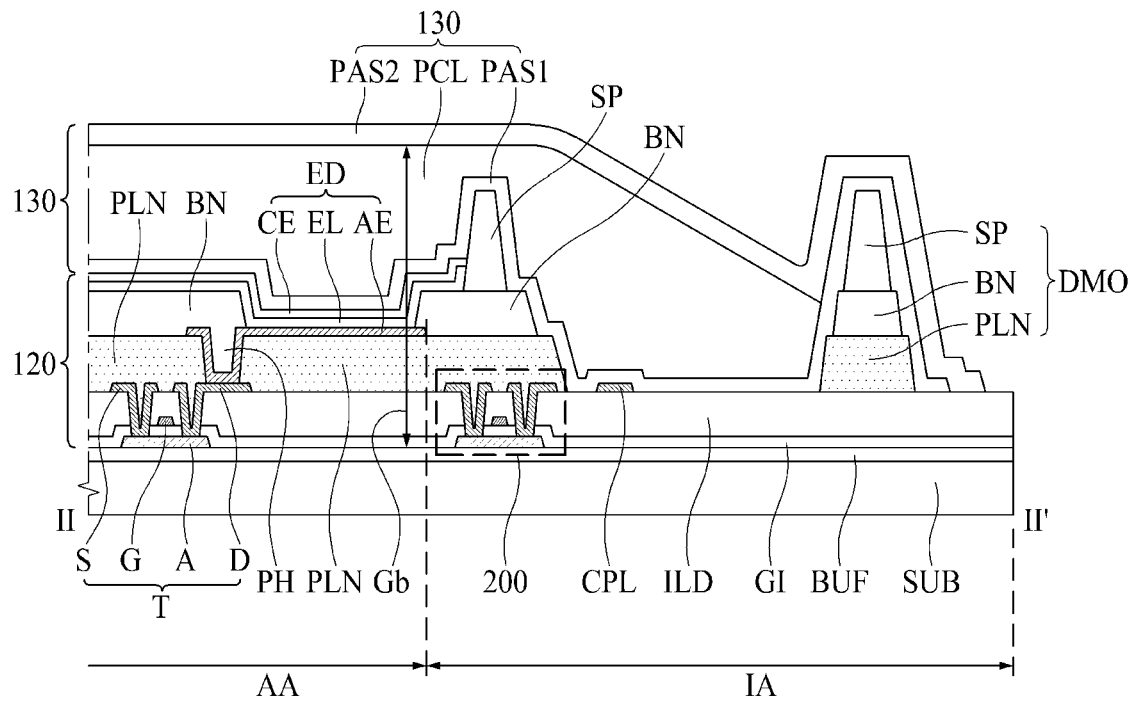
FIG. 4 is a sectional view taken along line II-II' in FIG. 1 and illustrates a structure of one edge of an electroluminescent display device according to an exemplary embodiment of the present disclosure.

Hereinafter, a sectional structure of an electroluminescent display device including a through-hole in a display area according to an exemplary embodiment of the present disclosure will be described with reference to FIGS. 3 and 4. FIG. 3 is a sectional view taken along line I-I' in FIG. 1 and illustrates a structure of a part in which a through-hole is disposed in an electroluminescent display device according to an exemplary embodiment of the present disclosure. FIG. 4 is a sectional view taken along line II-II' in FIG. 1 and illustrates a structure of one edge of an electroluminescent display device according to an exemplary embodiment of the present disclosure.

Referring to FIGS. 3 and 4, an electroluminescent display device according to an exemplary embodiment of the present disclosure includes a substrate SUB, a buffer film BUF, a pixel array layer 120, a spacer SP, an encapsulation layer 130, and a through-hole TH.

The substrate SUB includes a display area AA and a non-display area IA that surrounds the display area AA. The substrate SUB is a base board and is formed of a plastic material or a glass material. For example, the substrate SUB may be formed of an opaque material or a colored polyimide material. The substrate SUB may be a flexible substrate or a rigid substrate. For example, a flexible substrate SUB formed of a glass material may be a thin glass substrate having a thickness of 100 micrometers or less or may be a glass substrate which has been etched to have a thickness of 100 micrometers or less through a substrate etching process.

The buffer film BUF is deposited on the top surface of the substrate SUB to cover the entire surface of the substrate SUB. The buffer film BUF is formed on the top surface of the substrate SUB to prevent moisture from permeating the pixel array layer 120 via the substrate SUB which is weak to moisture. For example, the buffer film BUF may be formed of a plurality of inorganic films which are alternately stacked. For example, the buffer film BUF may be formed of a multi-layered film in which one or more inorganic films of a silicon oxide film (SiOx), a silicon nitride film (SiNx), and SiON are alternately stacked. The buffer film BUF may have a structure in which one organic buffer film and two or more inorganic buffer films are stacked. The buffer film BUF may be omitted if necessary.

The pixel array layer 120 is stacked on the buffer film BUF. The pixel array layer 120 includes a thin-film transistor layer, a planarization layer PLN, a bank BN, a spacer SP, and a light emitting element ED.

The thin-film transistor layer is provided in a plurality of pixels which are defined in the display area AA of the substrate SUB and the gate driving circuit 200 which is defined in the fourth non-display area IA4.

For example, the thin-film transistor layer includes a thin-film transistor T, a gate insulating film GI, and an interlayer insulating film ILD. Here, the thin-film transistor T illustrated in FIGS. 3 and 4 may be a driving thin-film transistor that is electrically connected to the light emitting element ED.

The thin-film transistor T includes a semiconductor layer A, a gate electrode G, a source electrode S, and a drain electrode D which are formed on the substrate SUB or the buffer film BUF. The thin-film transistor T illustrated in FIGS. 3 and 4 has a top gate structure in which the gate electrode G is located above the semiconductor layer A, but the present disclosure is not limited thereto. For example, the thin-film transistor T may have a bottom gate structure in which the gate electrode G is located below the semiconductor layer A or a double gate structure in which the gate electrode G is located above and below the semiconductor layer A.

The semiconductor layer A is formed on the substrate SUB or the buffer film BUF. The semiconductor layer A is formed of a silicon-based semiconductor material, an oxide-based semiconductor material or an organic-based semiconductor material and has a single-layered structure or a multi-layered structure. A light blocking layer for blocking external light which is incident on the semiconductor layer A may be additionally formed between the buffer film BUF and the substrate SUB.

The gate insulating film GI is formed on the entire substrate SUB to cover the semiconductor layer A. The gate insulating film GI is formed of an inorganic film such as a silicon oxide film (SiOx), a silicon nitride film (SiNx), or a multi-layered film thereof.

The gate electrode G is formed on the gate insulating film GI to overlap the semiconductor layer A. The gate electrode G is formed along with the scan lines SL. For example, the gate electrode G is formed of a single layer including one of molybdenum (Mo), aluminum (Al), chromium (Cr), gold (Au), titanium (Ti), nickel (Ni), neodymium (Nd), and copper (Cu) or an alloy thereof or multiple layers thereof.

The interlayer insulating film ILD is formed on the entire substrate SUB to cover the gate electrode G and the gate insulating film GI. The interlayer insulating film ILD provides a flat surface to the gate electrode G and the gate insulating film GI.

The source electrode S and the drain electrode D are formed on the interlayer insulating film ILD to overlap the semiconductor layer A with the gate electrode G interposed therebetween. The source electrode S and the drain electrode D are formed along with the data lines DL, the pixel driving power supply lines PL, and the common power supply line CPL. That is, the source electrode S, the drain electrode D, the data lines DL, the pixel driving power supply lines PL, and the common power supply line CPL are formed through a process of patterning a source/drain electrode material at the same time.

The source electrode S and the drain electrode D are connected to the semiconductor layer A via electrode contact holes that penetrate the interlayer insulating film ILD and the gate insulating film GI. The source electrode S and the drain electrode D are formed of a single layer including one of molybdenum (Mo), aluminum (Al), chromium (Cr), gold (Au), titanium (Ti), nickel (Ni), neodymium (Nd), and copper (Cu) or an alloy thereof or multiple layers thereof.

Here, the source electrode S of the thin-film transistor T illustrated in FIG. 3 is electrically connected to the pixel driving power supply line PL.

In this way, the thin-film transistor T provided in the pixel P of the substrate SUB constitutes a pixel circuit PC. The gate driving circuit 200 disposed in the fourth non-display area IA4 of the substrate SUB includes a thin-film transistor equal or similar to the thin-film transistor T provided in the pixel P.

The planarization layer PLN is formed on the entire substrate SUB to cover the thin-film transistor layer. The planarization layer PLN provides a flat surface on the thin-film transistor layer. For example, the planarization layer PLN is formed of an organic film such as an acryl resin, an epoxy resin, a phenolic resin, a polyamide resin, or a polyimide resin.

For example, the planarization layer PLN may include a pixel contact hole PH that exposes the drain electrode D of the driving thin-film transistor provided in the pixel P.

The bank BN (or a bank pattern) is disposed on the planarization layer PLN and defines an opening area (or an emission area) in the pixel P of the display area AA. The bank BN may be referred to as a pixel defining film.

Each light emitting element ED includes a pixel driving electrode AE, a light emitting layer EL, and a common electrode CE. The pixel driving electrode AE is formed on the planarization layer PLN and is electrically connected to the drain electrode D of the driving thin-film transistor via the pixel contact hole PH formed in the planarization layer PLN. In this case, the edge portion other than the middle portion of the pixel driving electrode AE overlapping the opening area of the pixel P is covered by the bank BN. The bank BN covers the edge part of the pixel driving electrode AE to define the opening area of the pixel P.

For example, the pixel driving electrode AE may be formed of a metal material having high reflectance. For example, the pixel driving electrode AE may be formed in a multilayered structure such as a stacked structure (Ti/Al/Ti) of aluminum (Al) and titanium (Ti), a stacked structure (ITO/Al/ITO) of aluminum (Al) and indium tin oxide (ITO), an APC alloy, and a stacked structure (ITO/APC/ITO) of an APC alloy and ITO or may be formed in a single-layered structure including one or an alloy of two or more selected from silver (Ag), aluminum (Al), molybdenum (Mo), gold (Au), magnesium (Mg), calcium (Ca), and barium (Ba).

The light emitting layer EL is formed on the entire display area AA of the substrate SUB to cover the pixel driving electrodes AE and the bank BN. For example, the light emitting layer EL includes two or more light emitting portions which are vertically stacked to emit white light. For example, the light emitting layer EL may include a first light emitting portion and a second light emitting portion for emitting white light by mixing first light and second light. Here, the first light emitting portion emits first light and includes a blue light emitting portion, a green light emitting portion, a red light emitting portion, a yellow light emitting portion, and a yellow-green light emitting portion. The second light emitting portion includes a light emitting portion that emits second light having a complementary color relationship with the first light out of the blue light emitting portion, the green light emitting portion, the red light emitting portion, the yellow light emitting portion, and the yellow-green light emitting portion.

For example, the light emitting layer EL may include one of a blue light emitting portion, a green light emitting portion, and a red light emitting portion for emitting light of a color corresponding to a color set for the pixel P. For example, the light emitting layer EL may include one of an organic light emitting layer, an inorganic light emitting layer, and a quantum-dot light emitting layer or may have a stacked or mixed structure of an organic light emitting layer (or an inorganic light emitting layer) and a quantum-dot light emitting layer.

Additionally, the light emitting element ED may further include a functional layer for enhancing emission efficiency and/or lifespan of the light emitting layer EL.

The common electrode CE is formed to be electrically connected to the light emitting layer EL. The common electrode CE is formed in the entire display area AA of the substrate SUB to be commonly connected to the light emitting layers EL provided in the pixels P.

For example, the common electrode CE may be formed of a transparent conductive material or a semi-transmissive conductive material that can transmit light. When the common electrode is formed of a semi-transmissive conductive material, emission efficiency of light emitted from the light emitting element ED can be enhanced by a microcavity structure. Examples of the semi-transmissive conductive material include magnesium (Mg), silver (Ag), and an alloy of magnesium (Mg) and silver (Ag). Additionally, a capping layer that adjusts a refractive index of light emitted from the light emitting element ED to enhance emission efficiency of light may be further formed on the common electrode CE.

The spacers SP are distributed and disposed in non-opening areas, that is, areas in which no light emitting element ED is disposed, in the display area AA. The spacers SP serve to prevent a screen mask and a substrate from coming into direct contact with each other in the course of depositing the light emitting layer EL. The spacer SP is disposed on the bank BN such that the light emitting layer EL and the common electrode CE extend over the spacer SP disposed inside the display area AA.

In some cases, the light emitting layer EL and/or the common electrode CE may not extend over the spacer SP. Since the spacer SP is disposed on only a part of the bank BN in the display area AA, the common electrode CE has a structure that covers the entire display area AA and is continuous even when the common electrode CE does not extend over the spacer SP.

The encapsulation layer 130 is formed to surround all the top surface and the side surface of the pixel array layer 120. The encapsulation layer 130 serves to prevent oxygen or moisture from permeating the light emitting element ED.

For example, the encapsulation layer 130 includes a first inorganic encapsulation layer PAS1, an organic encapsulation layer PCL on the first inorganic encapsulation layer PAS1, and a second inorganic encapsulation layer PAS2 on the organic encapsulation layer PCL. The first inorganic encapsulation layer PAS1 and the second inorganic encapsulation layer PAS2 serve to prevent permeation of moisture or oxygen. For example, the first inorganic encapsulation layer PAS1 and the second inorganic encapsulation layer PAS2 may be formed of an inorganic material such as silicon nitride, aluminum nitride, zirconium nitride, titanium nitride, hafnium nitride, tantalum nitride, silicon oxide, aluminum oxide, or titanium oxide. The first inorganic encapsulation layer PAS1 and the second inorganic encapsulation layer PAS2 can be formed through a chemical vapor deposition (CVD) process or an atomic layer deposition (ALD) process.

The organic encapsulation layer PCL has a structure in which it is sealed (surrounded) by the first inorganic encapsulation layer PAS1 and the second inorganic encapsulation layer PAS2. The organic encapsulation layer PCL is formed in a thickness greater than that of the first inorganic encapsulation layer PAS1 and/or the second inorganic encapsulation layer PAS such that particles which may be generated in the manufacturing process can be adsorbed and/or blocked. The organic encapsulation layer PCL may be formed of an organic material such as silicon oxycarbon (SiOCx) acryl or an epoxy-based resin. The organic encapsulation layer PCL can be formed using a coating process, for example, an ink-jet coating process or a slit coating process.

The electroluminescence display device according to an embodiment of the present disclosure may further include a dam structure. The dam structure includes an outer dam DMO that is disposed outside the display area AA and an inner dam DMI that is disposed inside the display area AA. The outer dam DMO is disposed in the non-display area IA of the substrate SUB such that the organic encapsulation layer PCL can be prevented from flowing out of the display area AA. The inner dam DMI is disposed in the display area AA to surround the through-hole TH and prevents the organic encapsulation layer PCL from flowing out from the display area AA to the through-hole TH. The inner dam DMI is illustrated only in FIG. 3 and the outer dam DMO is illustrated in FIG. 4.

For example, the outer dam DMO may be disposed outside the display area AA. More specifically, the outer dam DMO may be disposed outside the gate driving circuit 200 disposed outside the display area AA and outside the common power supply line CPL disposed outside the gate driving circuit 200. In some cases, the outer dam DMO may be disposed to overlap the outer part of the common power supply line CPL. In this case, it is possible to decease a bezel width by decreasing the width of the non-display area IA in which the gate driving circuit 200 and the common power supply line CPL are disposed.

The dam structure according to an exemplary embodiment of the present disclosure may have a triple-layered structure including the inner dam DMI and the outer dam DMO. For example, the dam structure may include a first layer which is the planarization film PLN, a second layer which is the bank BN, and a third layer which is the spacer SP. In the present disclosure, the "dam structure" refers to both the inner dam DMI and the outer dam DMO.

The first layer has a trapezoidal sectional structure in which the planarization film PLN is patterned. The second layer has a trapezoidal sectional structure that is stacked on the first layer. The third layer has a trapezoidal sectional structure that is stacked on the second layer. When the thickness of the organic encapsulation layer PCL is small enough to easily control diffusibility of the organic encapsulation layer PCL, the small height of the dam structure may do well. In this case, the third layer may be omitted.

The dam structure is covered by the first inorganic encapsulation layer PAS1 and/or the second inorganic encapsulation layer PAS2. The dam structure serves to hold the organic encapsulation layer PCL in the inner space and the dam structure is not covered with the organic encapsulation layer PCL. The organic encapsulation layer PCL may be in contact with a part of the inner wall surface of the dam structure. For example, the height of the organic encapsulation layer PCL to the top surface thereof at the edge may be greater than the height of the first layer of the dam structure and may be less than the height of the second layer. Alternatively, the height of the organic encapsulation layer PCL to the top surface thereof at the edge may be greater than the height of the second layer of the dam structure and may be less than the height of the third layer.

It is preferable that the height of the organic encapsulation layer PCL to the top surface thereof at the edge be less than the total height of the dam structure. As a result, on the top surface and the outer side wall of the dam structure, the first inorganic encapsulation layer PAS1 and the second inorganic encapsulation layer PAS2 are in surface contact with each other. For example, the application area of the organic encapsulation layer PCL is limited to the inside of the inner side wall of the outer dam DMO and the inner dam DMI. Accordingly, the first inorganic encapsulation layer PAS1 and the second inorganic encapsulation layer PAS2 are in surface contact with each other until they extend over the top surface from a part of the inner side wall of the outer dam DMO and the inner dam DMI and reach the outer side wall.

The structure of the inner dam DMI in an embodiment of the present disclosure will be described below in more detail with reference back to FIGS. 2 and 3. The inner dam DMI in the embodiment of the present disclosure is disposed between the through-hole TH and the neighboring pixels P' surrounding the through-hole TH. Accordingly, unlike the outer dam DMO, a partial configuration of the light emitting element ED may be stacked on the inner dam DMI. For example, the light emitting layer EL and the common electrode CE may be stacked to extend over the inner dam DMI.

The inner dam DMI may have a normal taper shape. When the inner dam DMI has a normal taper shape, loss of the organic encapsulation layer PCL in the vicinity of the through-hole TH can be prevented, but the light emitting layer EL may be exposed from the side surface of the through-hole TH and be weak to moisture. For the purpose of prevention thereof, the inner dam DMI may have an inverse taper shape. When the inner dam DMI has an inverse taper shape, the light emitting layer EL may be cut off at a lower end of the inner dam DMI. In this case, it is possible to prevent moisture, which permeates via a part of the light emitting layer EL exposed from the through-hole TH, from diffusing into the neighboring pixels P' disposed around the through-hole TH.

In order to secure a maximum display area ratio of the display area AA, the inner dam DMI is preferably disposed to be very close to the through-hole TH. Accordingly, moisture cannot be completely blocked by only the inner dam DMI having an inverse taper shape. In the present disclosure, a concave-convex pattern PAT that can completely block diffusion of moisture, which is supposed to permeate via the light emitting layer EL exposed from the side surface of the through-hole TH, into the neighboring pixels P' regardless of whether the inner dam DMI has a normal taper shape or an inverse taper shape is further provided.

Figure 5A:
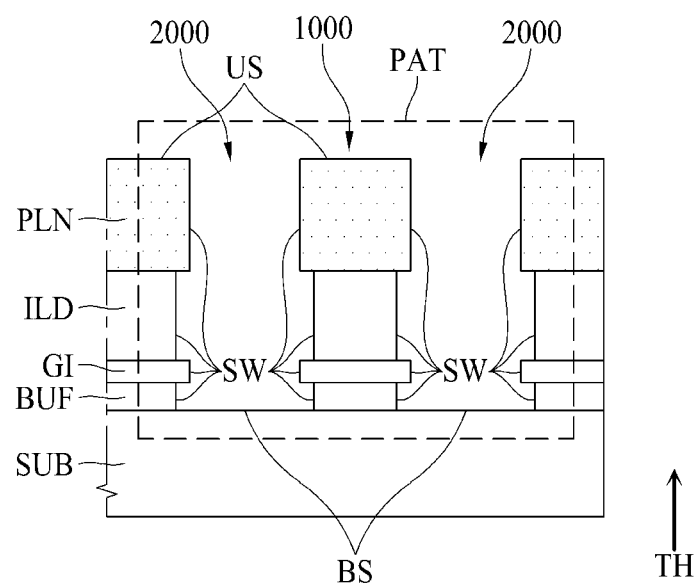
FIG. 5A is an enlarged sectional view illustrating a structure of a concave-convex pattern immediately after the concave-convex pattern has been formed in an example of the present disclosure.
Figure 5B:
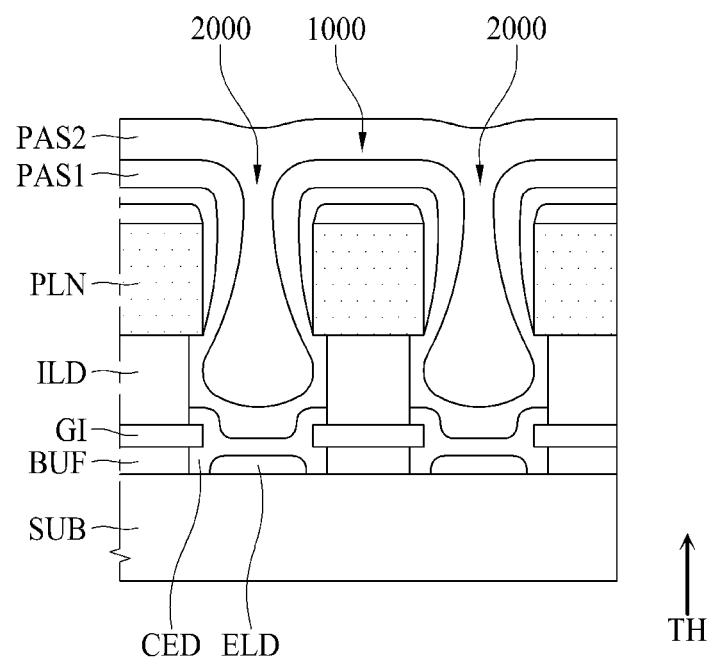
FIG. 5B is an enlarged sectional view illustrating a structure of a concave-convex pattern after the concave-convex pattern and a light emitting element have been formed in an example of the present disclosure.

Hereinafter, the concave-convex pattern according to the present disclosure will be described in more detail with reference to FIGS. 5A and 5B in addition to FIGS. 2 and 3. FIG. 5A is an enlarged sectional view illustrating a structure of a concave-convex pattern immediately after the concave-convex pattern has been formed in an example of the present disclosure. FIG. 5B is an enlarged sectional view illustrating a structure of a concave-convex pattern after the concave-convex pattern and a light emitting element have been formed in an example of the present disclosure.

A concave-convex pattern PAT has a closed curve shape corresponding to the shape of the through-hole TH. For example, when the through-hole TH has a circular shape, the concave-convex pattern PAT may have a circular shape. Alternatively, the concave-convex pattern PAT may have an elliptical shape surrounding the through-hole TH regardless of the shape of the through-hole TH. For example, when the through-hole TH has a polygonal shape such as a quadrangular shape, a hexagonal shape, or an octagonal shape, the concave-convex pattern PAT may have a polygonal shape, a circular shape, or an elliptical shape surrounding the through-hole TH. In the following description, for the purpose of convenience, it is assumed the through-hole TH has a circular shape and the concave-convex pattern PAT has a circular shape which is concentric with the through-hole TH to surround the through-hole TH.

The concave-convex pattern PAT is preferably disposed between the inner dam DMI and the through-hole TH. In a sectional structure, the concave-convex pattern PAT has a well or trench shape in which the buffer film BUF and the pixel array layer 120 stacked on the substrate SUB are removed by a predetermined width. More specifically, after stacking the buffer film BUF on the substrate SUB, forming the pixel array layer 120 on the buffer film BUF, stacking the pixel driving electrode AE thereon, and patterning the bank defining an emission area, the pixel array layer 120 and the buffer film BUF can be etched together to form the concave-convex pattern PAT.

The concave-convex pattern PAT includes a concave portion 2000 and a convex portion 1000. Two concave portions 2000 are connected to one side and the other side of one convex portion 1000. That is, one convex portion 1000 is disposed between two concave portions 2000 to form one concave-convex pattern PAT. In some cases, only the convex portion 1000 may be defined as a concave-convex pattern PAT. Here, the convex portion 1000, the concave portions 2000 formed inside and outside the convex portion 1000, and a partial area near the concave portions 2000 which are included in a rectangular area indicated by a dashed line in FIGS. 3 and 5A are defined as a concave-convex pattern PAT.

The concave-convex pattern PAT includes two concave portions 2000 that are formed to be separated by a predetermined distance between the inner dam DMI and the through-hole TH and one convex portion 1000 with a width corresponding to the predetermined distance by which the two concave portions 2000 are separated. The concave portions 2000 are formed to expose the top surface of the substrate SUB by removing the bank BN, the planarization film PLN, the intermediate insulating layer ILD included in the thin-film transistor layer, the gate insulating film GI, and the buffer film BUF which are stacked on the substrate SUB.

The concave-convex pattern PAT includes a bottom surface BS, a top surface US, and a side wall SW that connects the bottom surface BS and the top surface US. The bottom surface BS is defined as the surface of the substrate SUB which is exposed by the concave portion 2000 penetrating the buffer film BUF and the pixel array layer 120. The top surface US is defined as the uppermost surface of the substrate SUB in a state in which the concave-convex pattern PAT is formed. For example, when the concave-convex pattern PAT is formed in the planarization film PLN exposed after the bank BN has been patterned, the top surface of the planarization film PLN is defined as the top surface US. The side wall SW is defined as a side surface of the concave-convex pattern PAT that connects the bottom surface BS and the top surface US.

The convex portion 1000 includes a top surface US and two side walls SW. The concave portion 2000 includes two side walls SW and one bottom surface BS. The convex portion 1000 is formed by etching the buffer film BUF, the gate insulating film GI, the intermediate insulating film ILD, and the planarization film PLN which are stacked on the substrate SUB between the inner dam DMI and the through-hole TH to form the concave portion 2000.

The side wall SW of the concave-convex pattern PAT has a rugged sawteethed surface which is not smooth due to a difference in characteristics, particularly, a difference in etching rate in the course of etching thin-film layers having different etching rates for a specific etchant. For example, the concave-convex pattern PAT may be formed by simultaneously etching the planarization film PLN, the intermediate insulating film ILD, the gate insulating film GI, and the buffer film BUF. The planarization film PLN, the intermediate insulating film ILD, the gate insulating film GI, and the buffer film BUF have different physical characteristics, and thus have different etching rates for the same etchant. As a result, a certain thin-film layer may be more etched and another thin-film layer may be less etched. For example, the intermediate insulating film ILD may be more etched than the planarization film PLN and the gate insulating film GI may be less etched than the intermediate insulating film ILD. The buffer film BUF may be less etched than the gate insulating film GI. As a result, as illustrated in FIG. 5A, the side wall SW has a zigzagged or rugged sawteethed surface in which a protruding surface and a recessed surface are alternately continuously formed.

After the concave-convex pattern PAT has been formed, a light emitting layer EL is deposited thereon. The light emitting layer EL is stacked on the bottom surface BS of the concave-convex pattern PAT and the top surface US of the concave-convex pattern PAT. Since the side wall SW of the concave-convex pattern PAT has a sawteethed surface, the light emitting layer EL is not formed continuously on the side wall SW, but is cut off as illustrated in FIG. 5B.

For example, when the light emitting layer EL is deposited on the planarization film PLN as illustrated in FIG. 5B, the light emitting layer EL is formed on the planarization film PLN. However, the light emitting layer EL is not stacked on the side walls SW. On the other hand, the light emitting layer EL is stacked on the bottom surface BS. The residual light emitting layer ELD is stacked in only an area which is exposed from the planarization film PLN or the gate insulating film GI having an etched end surface protruding into the concave portion 2000 due to less etching on the bottom surface BS. The light emitting layer EL is cut off due to a stepped portion between the protruding surface and the recessed surface formed on the side wall SW and is not continuous.

As a result, even when moisture permeates the light emitting layer EL which is exposed from the side surface of the through-hole TH, it is possible to reliably prevent diffusion of moisture into the neighboring pixels P' disposed near the through-hole TH by the concave-convex pattern PAT.

The common electrode CE is stacked on the light emitting layer EL. The common electrode CE is stacked on the top surface US and the bottom surface BS of the concave-convex pattern PAT. In some cases, the common electrode CE may be deposited on the side walls SW of the concave-convex pattern PAT. However, since the side walls of the concave-convex pattern PAT include a rugged surface, the common electrode CE does not fully cover the side walls and covers the light emitting layer EL within the concave portion 2000.

For example, as illustrated in FIG. 5B, the common electrode CE is stacked on the top surface of the planarization film PLN. The common electrode CE is deposited on the side wall SW of the planarization film PLN corresponding to the upper portion of the side wall SW of the concave-convex pattern PAT. However, the rugged side wall SW in which a protruding surface and a recessed surface are continuous due to a difference in etching rate may not be fully covered by the common electrode. The residual common electrode CED is deposited to cover the residual light emitting layer ELD on the bottom surface BS and a part of the side wall SW.

Subsequently, an encapsulation film 130 is stacked on the common electrode CE. A first inorganic encapsulation layer PAS1 of the encapsulation film 130 is first stacked. The first inorganic encapsulation layer PAS1 is stacked on the top surface US and the bottom surface BS of the concave-convex pattern PAT. The first inorganic encapsulation layer PAS1 is also deposited on the side wall SW of the concave-convex pattern PAT. The first inorganic encapsulation layer PAS1 may have a shape which almost fills the inside of the concave portions 2000. For example, as illustrated in FIG. 5B, the first inorganic encapsulation layer PAS1 is stacked on the light emitting layer EL and the common electrode CE on the top surface of the planarization film PLN. The first inorganic encapsulation layer PAS1 is also stacked on the side walls SW of the concave-convex pattern PAT. Since the sawteethed surfaces of the side walls SW are smoothed to a certain extent by the common electrode CE and the residual common electrode CED, the first inorganic encapsulation layer PAS1 is stacked along the shape of the concave-convex pattern PAT while covering the side walls SW.

An organic encapsulation layer PCL is deposited on the first inorganic encapsulation layer PAS1. The organic encapsulation layer PCL is deposited in only a space between the inner dam DMI and the outer dam DMO and thus is not stacked on the concave-convex pattern PAT. For example, as illustrated in FIG. 3, the organic encapsulation layer PCL is deposited to only a part of the inside surface of the inner dam DMI. As illustrated in FIG. 4, the organic encapsulation layer PCL is deposited to only a part of the inside surface of the outer dam DMI. Accordingly, the organic encapsulation layer PCL is not deposited on the concave-convex pattern PAT which is disposed between the inner dam DMI and the through-hole TH.

A second inorganic encapsulation layer PAS2 is stacked on the organic encapsulation layer PCL. Since the organic encapsulation layer PCL is not deposited between the inner dam DMI and the through-hole TH, the second inorganic encapsulation layer PAS2 is stacked on the concave-convex pattern PAT while being in direct contact with the first inorganic encapsulation layer PAS1. In some cases, as illustrated in FIG. 5B, the second inorganic encapsulation layer PAS2 may be deposited to fully cover the concave portions 2000 of the concave-convex pattern PAT.

The convex portion 1000 included in the concave-convex pattern PAT according to the present disclosure has a sectional shape which is normally tapered or inversely tapered. Since the side walls SW of the concave-convex pattern PAT include sawteethed surfaces, the light emitting layer EL is not be deposited to be continuous on the side walls SW. Accordingly, the convex portion 1000 does not have to be inversely tapered in order to cut off continuity of the light emitting layer EL. The shape of the convex portion 1000 can be determined depending on characteristics of an etching process of forming the concave portions 2000. In the present disclosure, since the shape of the convex portion 1000 is not particularly limited, it is possible to easily perform the process of forming the concave portions 2000 without any particular limit. The sawteethed surfaces of the side walls SW can be achieved by selecting a material having different etching rates for the insulating layers as an etchant because the types of the stacked insulating layers are different from each other.

Figure 6:
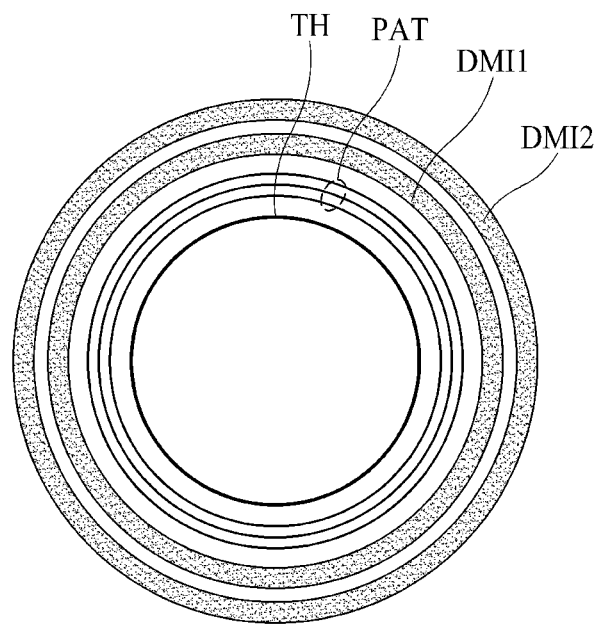
FIG. 6 is a plan view illustrating a structure of a through-hole and a concave-convex pattern which are disposed in a display area of an electroluminescent display device according to another exemplary embodiment of the present disclosure.

Hereinafter, referring to FIG. 6, an electroluminescent display device according to another embodiment of the present disclosure will be described. FIG. 6 is a plan view illustrating a structure of a through-hole and a concave-convex pattern which are disposed in a display area of the electroluminescent display device according to another embodiment of the present disclosure. Although not illustrated in FIG. 6, reference signs which are described below are the same as in the corresponding drawings of FIGS. 1 to 4.

Referring to FIG. 6, a through-hole TH is formed in a display area of a substrate SUB. For example, the through-hole TH may have a circular shape. An inner dam DMI is formed around the through-hole TH. The inner dam DMI may have a circular shape which is concentric with the concave portion 2000 and which has a greater radius. The inner dam DMI includes a first inner dam DMI1 and a second inner dam DMI2. The first inner dam DMI1 is disposed closer to the through-hole TH and the second inner dam DMI2 may have a circular shape which is concentric with the first inner dam DMI1 and which has a greater radius.

A concave-convex pattern PAT is disposed between the first inner dam DMI1 and the through-hole TH. The concave-convex pattern PAT has a circular shape which is concentric with the through-hole TH and the first inner dam DMI1 and has a radius greater than that of the through-hole TH and less than that of the first inner dam DMI1. The concave-convex pattern PAT includes three concave portions and two convex portions which are disposed between the three concave portions.

For example, the concave-convex pattern PAT may be formed to include more convex portions. When the number of convex portions 1000 is excessively great, the area of a hole boundary part THB increases. In this case, the area of the through-hole TH increases and thus a display function may degrade. Accordingly, it is preferable that the number of convex portions 1000 be less than five. That is, one to five convex portions 1000 are continuously disposed at predetermined intervals in the hole boundary part THB. The concave portions 2000 are disposed between the convex portions 1000. The interval between the convex portions 1000 corresponds to the width of the concave portion 2000.

In this way, in the electroluminescence display device according to the present disclosure, a through-hole TH is formed in a display area, an inner dam DMI is formed to surround the through-hole TH, and a concave-convex pattern PAT is provided between the through-hole TH and the inner dam DMI. The concave-convex pattern PAT includes a plurality of concave portions 2000 which are formed by etching insulating layers of a pixel array layer 120. Particularly, the side walls SW of the concave portions 2000 have a sawteethed surface due to a difference in etching rates between the insulating layers. A light emitting layer EL which is stacked on the concave-convex pattern PAT is cut off by the structure of the concave portions and the convex portions and the side walls SW having a sawteethed surface. The light emitting layer EL which is cut off has a structure in which the light emitting layer EL is fully covered by the common electrode CE, the first inorganic encapsulation layer PAS1, and the second inorganic encapsulation layer PAS2. As a result, even when moisture permeates via the light emitting layer EL which is exposed from the side surface of the through-hole TH, it is possible to prevent the moisture from diffusing into the pixels P by the concave-convex pattern PAT and the first inorganic encapsulation layer PAS1 covering the concave-convex pattern PAT.

The electroluminescence display device according to the present disclosure includes a through-hole TH penetrating a display panel in a display area. The through-hole TH has a structure from which elements for a display function and a substrate SUB are removed. Accordingly, various components can be installed or added to correspond to the through-hole TH.

Figure 7:
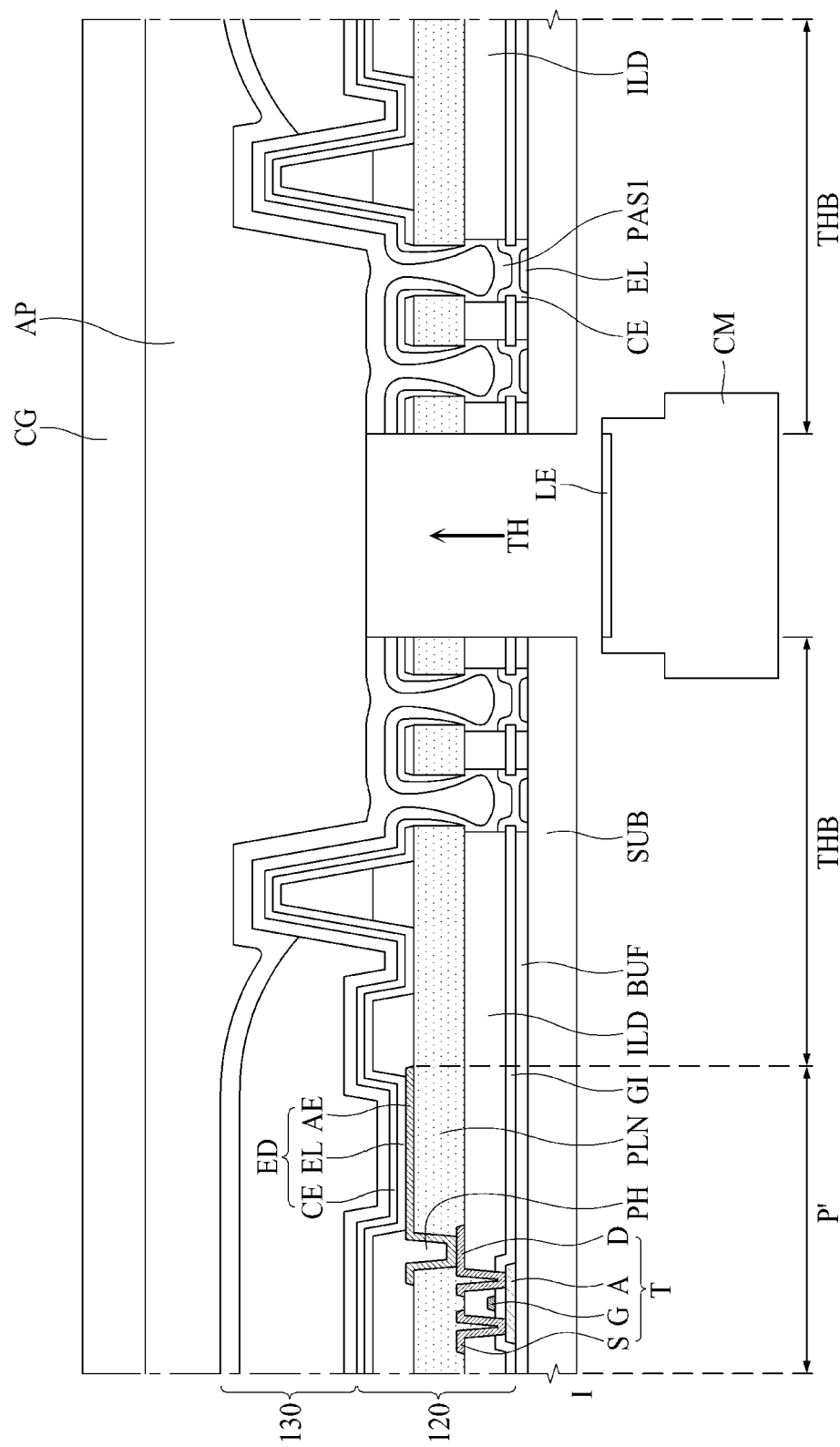
FIG. 7 is an enlarged sectional view illustrating an example in which a camera is disposed in an electroluminescent display device including a through-hole according to an exemplary embodiment of the present disclosure.

As illustrated in FIG. 7, a camera CM or an optical sensor can be disposed to correspond to the through-hole TH. FIG. 7 is an enlarged sectional view illustrating an example in which a camera is disposed in an electroluminescence display device according to an embodiment of the present disclosure.

A camera CM is located on the rear surface of the display panel and is disposed such that the center of the through-hole TH and the center of a lens LE match each other. When the camera CM is disposed on the rear surface of the display panel, the through-hole TH may not have a perfect hole shape. For example, as illustrated in FIG. 7, a cover glass CG may be bonded to the top surface of the encapsulation layer 130 in the electroluminescence display device according to the present disclosure using an optical adhesive AP. In this case, the through-hole TH is open on the surface of the display device facing the camera CM and is clogged on the top surface which is watched by a user by the cover glass CG Since most elements of the display panel other than the cover glass CG are removed from the front surface of the camera CM by the through-hole TH, imaging performance can be secured without being optically hindered.

Figure 8:
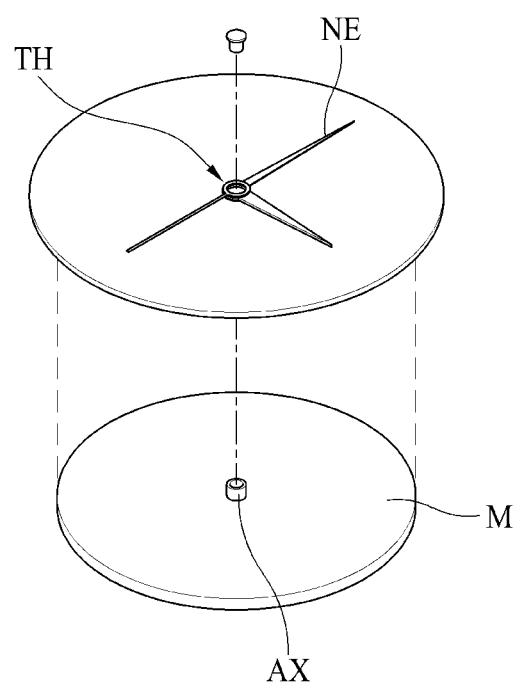
FIG. 8 is a diagram illustrating a timepiece employing an electroluminescent display device including a through-hole according to another exemplary embodiment of the present disclosure.

For example, as illustrated in FIG. 8, a drive shaft which is inserted into the through-hole TH may be further provided. For example, the electroluminescence display device according to the present disclosure including a through-hole can be applied to a timepiece. FIG. 8 is a diagram illustrating a timepiece employing the electroluminescence display device according to another embodiment of the present disclosure including a through-hole.

The electroluminescence display device according to the present disclosure including a through-hole may have a timepiece shape. The electroluminescence display device including a through-hole TH can display characters or numerals of a timepiece or various background pictures. A timepiece driving unit M is disposed on the rear surface of the display device. A drive shaft AX that drives hands of the timepiece NE is provided in the timepiece driving unit. The drive shaft AX protrudes from the front surface of the display device via the through-hole TH. The hands of the timepiece NE are mounted on the drive shaft AX protruding from the front surface of the display device. The hands of the timepiece NE include an hour hand, a minute hand, and a second hand which are mounted on the drive shaft AX passing through the through-hole TH.

The electroluminescence display device according to the exemplary embodiments of the present disclosure can be applied to various products such as a television, a notebook personal computer (PC), a monitor, a refrigerator, a microwave oven, a washing machine, and a camera in addition to mobile electronic devices such as an electronic notebook, an electronic book, a portable multimedia player (PMP), a navigation device, an ultra-mobile PC (UMPC), a smartphone, a mobile communication terminal, a mobile phone, a tablet PC, a smart watch, a watch phone, and a wearable device.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

In the electroluminescence display device according to the present disclosure, since a through-hole is provided in a display area, the area ratio of a non-display area is minimized and the area ratio of the display area is maximized. In the electroluminescence display device according to the present disclosure, since a plurality of concave-convex patterns are provided around the through-hole, the light emitting layer is partially cut off and thus moisture is prevented from permeating a light emitting element from the outside. In the electroluminescence display device according to the present disclosure, since a hole penetrating the display panel is provided in the display area, the EL display device can be applied to various products with high applicability. In the electroluminescence display device according to the present disclosure, even when a hole penetrating the display panel is formed in the display area, moisture and particles from the outside are prevented from diffusing and propagating into display elements, whereby it is possible to secure safety and to secure a lifespan of a product.

In addition to the above-mentioned advantageous effects of the present disclosure, other features and advantages of the present disclosure will be clearly understood by those skilled in the art from the above description or explanation.

While embodiments of the present disclosure have been described above in detail in conjunction with the accompanying drawings, the present disclosure is not limited to the embodiments and can be modified and implemented in various forms without departing from the technical spirit of the present disclosure. Accordingly, the embodiments disclosed in the present disclosure are not for limiting the technical spirit of the present disclosure but for explaining it, and the scope of the technical spirit of the present disclosure is not limited by the embodiments. Therefore, the above-mentioned embodiments should be understood to be exemplary, not definitive, in all respects. The scope of the present disclosure should be defined by the appended claims, and all the technical spirits in equivalent ranges thereof should be construed to belong to the scope of the present disclosure.

What is claimed is:

1. An electroluminescence display device comprising:
    a display area in which a plurality of pixels, each of which includes a light emitting element that displays an image and a driving element that drives the light emitting element, are disposed on a substrate, the light emitting element including a first electrode, a second electrode, and a light emitting layer between the first electrode and the second electrode;
    a non-display area that surrounds the display area on the substrate;
    a through-hole that is disposed in the display area and does not include the substrate, the light emitting elements, and the driving elements;
    an inner dam that surrounds the through-hole;
    a concave-convex pattern that surrounds the through-hole between the through-hole and the inner dam; and
    an encapsulation film covering the display area including the through-hole,
    wherein the concave-convex pattern includes:
        at least two concave portions disposed between the through-hole and the inner dam; and
        at least one convex portion disposed between the at least two concave portions,
    wherein the encapsulation film includes:
    a first inorganic encapsulation layer;
    an organic encapsulation layer that is disposed on the first inorganic encapsulation layer; and
    a second inorganic encapsulation layer that is disposed on a top surface of the organic encapsulation layer, and
    wherein the concave portions are filled with the first inorganic encapsulation layer and the second inorganic encapsulation layer, except the organic encapsulation layer, and
    wherein a portion of the light emitting layer is in physical contact with the at least one convex portion, a portion of the second electrode is on the portion of the light emitting layer, a portion of the first inorganic encapsulation layer is on the portion of the second electrode, and a portion of the second inorganic encapsulation layer is on the portion of the first inorganic encapsulation layer.

2. The electroluminescence display device according to claim 1, wherein each light emitting element includes:
    a pixel electrode that is connected to the corresponding driving element;
    a light emitting layer that is disposed entirely in the display area and stacked on the pixel electrode; and
    a common electrode that is stacked on the light emitting layer.

3. The electroluminescence display device according to claim 2, wherein each of the concave portions exposes a portion of a top surface of the substrate, and
    two of the concave portions are adjacent to each other.

4. The electroluminescence display device according to claim 3, wherein the concave-convex pattern includes:
    a bottom surface of the concave-convex pattern that is defined by the top surface of the substrate exposed by the two adjacent concave portions;
    a top surface of the concave-convex pattern that is defined on an uppermost surface of the convex portion; and
    side walls that connect the bottom surface of the concave-convex pattern and the top surface of the concave-convex pattern, and
    wherein the light emitting layer of each light emitting element is stacked on the bottom surface of the concave-convex pattern and the top surface of the concave-convex pattern other than the side walls.

5. The electroluminescence display device according to claim 4, wherein the side walls of the concave-convex pattern include a sawteethed surface including a protruding surface and a recessed surface which are alternately continuous.

6. The electroluminescence display device according to claim 5, wherein the light emitting layer has a structure in which the light emitting layer is cut off between the protruding surface and the recessed surface.

7. The electroluminescence display device according to claim 3, wherein one to five convex portions are continuously disposed at predetermined intervals in a hole boundary part between the through-hole and the pixels neighboring to the through-hole.

8. The electroluminescence display device according to claim 2, wherein each light emitting element is disposed on a buffer film that is stacked on the substrate, a gate insulating film that is stacked on the buffer film, an intermediate insulating film that is stacked on the gate insulating film, and a planarization film that is stacked on the intermediate insulating film, wherein the concave-convex pattern includes:
a bottom surface of the concave-convex pattern which is a top surface of the substrate which is exposed via the buffer film, the gate insulating film, the intermediate insulating film, and the planarization film between the through-hole and the inner dam; and
a side wall that connects the bottom surface of the concave-convex pattern and a top surface of the planarization film, and wherein the light emitting layer is stacked on the top surface of the planarization film and the bottom surface of the concave-convex pattern other than the side wall.

9. The electroluminescence display device according to claim 8, wherein the side wall includes a protruding surface and a recessed surface that are alternately continuous due to a difference in etching rate between the buffer film, the gate insulating film, the intermediate insulating film, and the planarization film, and wherein the light emitting layer has a structure in which the light emitting layer is cut off in a stepped portion between the protruding surface and the recessed surface.

10. The electroluminescence display device according to claim 2, further comprising:
a buffer film that is stacked on the substrate;
a thin-film transistor layer that is disposed on the buffer film;
a planarization film that covers the thin-film transistor layer;
a pixel driving electrode that is connected to a thin-film transistor disposed in the thin-film transistor layer and disposed on the planarization film; and
a bank that defines an emission area in the pixel driving electrode,
wherein the concave portions are formed to expose a top surface of the substrate by removing the bank, the planarization film, the thin-film transistor layer, and the buffer film and disposed to be separated from each other by a predetermined distance; and
wherein the convex portion has a width corresponding to the predetermined distance between the two concave portions.

11. The electroluminescence display device according to claim 10, wherein the concave-convex pattern includes:
a bottom surface of the concave-convex pattern that is defined by the top surface of the substrate exposed by the concave portions;
a top surface of the concave-convex pattern that is defined on an uppermost surface of the convex portion; and
side walls that connect the bottom surface of the concave-convex pattern and the top surface of the concave-convex pattern, and wherein the light emitting layer of each light emitting element is stacked on the bottom surface of the concave-convex pattern and the top surface of the concave-convex pattern other than the side walls.

12. The electroluminescence display device according to claim 11, wherein each side wall includes a sawteethed surface that is formed by differentially etching the bank, the planarization film, the thin-film transistor layer, and the buffer film.

13. The electroluminescence display device according to claim 10, further comprising:
an outer dam that is disposed in the non-display area and surrounds the display area;
a light emitting layer that covers the pixels on the bank between the outer dam and the through-hole, the inner dam, and the concave-convex pattern; and
a common electrode that is stacked on the light emitting layer,
wherein the encapsulation film covers the common electrode.

14. The electroluminescence display device according to claim 13, wherein the through-hole does not include the buffer film, the thin-film transistor layer, the planarization film, the light emitting layer, the common electrode, and the encapsulation film, and
wherein the light emitting layer is exposed from a side surface of the through-hole.

15. The electroluminescence display device according to claim 14, wherein the organic encapsulation layer is in contact with a part of an inner surface of the inner dam, and
wherein the first inorganic encapsulation layer and the second inorganic encapsulation layer between the through-hole and the inner dam are in surface contact with each other.

16. The electroluminescence display device according to claim 15, wherein the first inorganic encapsulation layer is stacked along a shape of the concave-convex pattern while covering side walls of the concave-convex pattern.

17. The electroluminescence display device according to claim 1, further comprising a camera that is disposed to correspond to the through-hole.

18. The electroluminescence display device according to claim 1, wherein the concave-convex pattern has a closed curve shape corresponding to a shape of the through-hole.

19. The electroluminescence display device according to claim 1, wherein the inner dam includes a first inner dam and a second inner dam, the first inner dam is disposed closer to the through-hole than the second inner dam and the second inner dam has a circular shape which is concentric with the first inner dam and which has a greater radius than that of the first inner dam.

20. The electroluminescence display device according to claim 19, wherein the concave-convex pattern has a circular shape which is concentric with the through-hole and the first inner dam and has a radius greater than that of the through-hole and less than that of the first inner dam.

* * * * *